(12) United States Patent
Ferran

(10) Patent No.: US 8,901,993 B1
(45) Date of Patent: *Dec. 2, 2014

(54) METHOD AND APPARATUS FOR ACQUIRING NOISE REDUCED HIGH FREQUENCY SIGNALS

(71) Applicant: Reno Sub-Systems Canada, Incorporated, Bedford (CA)

(72) Inventor: Robert J. Ferran, San Diego, CA (US)

(73) Assignee: Reno Sub-Systems Canada Incorporated, Bedford, Nova Scotia (CA)

(*) Notice: Subject to any disclaimer, the term of this patent is extended or adjusted under 35 U.S.C. 154(b) by 0 days.

This patent is subject to a terminal disclaimer.

(21) Appl. No.: 14/308,359

(22) Filed: Jun. 18, 2014

Related U.S. Application Data

(63) Continuation of application No. 14/145,831, filed on Dec. 31, 2013, now Pat. No. 8,760,221.

(60) Provisional application No. 61/765,945, filed on Feb. 18, 2013.

(51) Int. Cl.
*H03B 1/00* (2006.01)
*H03K 5/1252* (2006.01)

(52) U.S. Cl.
CPC .................................... *H03K 5/1252* (2013.01)
USPC ............................................ 327/551; 327/91

(58) Field of Classification Search
CPC ............. A61B 2562/0247; B60R 2021/01516; B60R 2021/01529
USPC ............................... 327/91, 94, 379, 551, 552
See application file for complete search history.

(56) References Cited

U.S. PATENT DOCUMENTS

| 4,754,411 A | 6/1988 | Wason |
| 4,916,391 A | 4/1990 | Doerman et al. |

*Primary Examiner* — William Hernandez
(74) *Attorney, Agent, or Firm* — Jerry Turner Sewell

(57) ABSTRACT

A system and method receive the output signal from a capacitance diaphragm gauge (CDG) and generate a noise reduced output signal. An input signal processing circuit receives an input signal from a signal source that drives the CDG. The input signal processing circuit generates a segment of N normalized digital samples of the input signal. An output signal processing circuit receives the output signal from the CDG and generates M segments of N digital samples of the CDG output signal and averages the corresponding samples in the M segments to generate a signal segment of N averaged samples. Each of the N averaged samples is multiplied by a corresponding one of the N normalized samples to generate N products. The N products are averaged to generate an average product, which is multiplied by a constant to generate a system output signal with reduced noise.

5 Claims, 4 Drawing Sheets

METHOD AND APPARATUS FOR ACQUIRING NOISE REDUCED HIGH FREQUENCY SIGNALS

RELATED APPLICATIONS

The present application is a continuation of U.S. patent application Ser. No. 14/145,831, filed on Dec. 31, 2013, which claims the benefit of priority under 35 USC §119(e) to U.S. Provisional Application No. 61/765,945 filed on Feb. 18, 2013, which applications are incorporated by reference herein.

BACKGROUND OF THE INVENTION

1. Field of the Invention

The present invention is in the field of capacitance diaphragm gauges which measure pressure based on the deflection of a diaphragm.

2. Description of the Related Art

Absolute capacitance diaphragm gauges (CDGs) measure pressure by sensing the capacitance change associated with deflection of a diaphragm whereby one side of the diaphragm ("the Px side") is exposed to the pressure to be measured (Px) and the other side of the diaphragm is exposed to a sealed reference vacuum cavity in which an ultrahigh vacuum (e.g., less than $10^{-9}$ Torr) has been created prior to the sealing of the reference cavity.

The CDG measures capacitance between a diaphragm and one or more fixed electrodes housed in the reference vacuum cavity. When the pressure on the Px side of the diaphragm is higher than the pressure in the reference vacuum cavity, the diaphragm deflects in the direction of the fixed electrode (or electrodes), which increases the measured capacitance. As the pressure on the Px side of the diaphragm decreases, the pressure differential across the diaphragm diminishes and the diaphragm moves away from the fixed electrode (or electrodes) in the reference vacuum cavity, which reduces the measured capacitance.

As the pressure on the Px side of the diaphragm approaches the pressure in the reference vacuum cavity, the pressure differential across the diaphragm becomes sufficiently small as to be considered as the "zero point" for the CDG. This fixed zero point is established during the calibration of the CDG and is used as a reference in subsequent pressure measurements.

CDGs are commonly used to the measure pressure in vacuum chambers in which thin or thick films of material are deposited on a substrate. One common example of usage is to measure pressure during the deposition of materials onto the surface of silicon wafers during the fabrication of semiconductor devices. CDGs are quite useful in vacuum deposition processes that utilize multiple gasses because capacitance diaphragm gauges are highly accurate and are able to measure absolute pressure independent of gas composition.

The accuracy of the measurement of pressure by a CDG can be negatively impacted by several factors, one of which is the signal noise within the electronic circuits that convert the capacitance changes caused by movement of the diaphragm in response to pressure changes. The signal noise may result from random noise that is often present in electronic systems and noise at spurious frequencies caused by other electronic systems in the proximity to the CDG sensor system. Although such signal noises can be removed by digital or analog filters, the costs of implementing such filters may be prohibitive. The costs include economic costs and physical costs (e.g., space requirements within enclosures).

SUMMARY OF THE INVENTION

A need exists for an alternative apparatus and an alternative method for removing random noise and spurious frequencies in a pressure measuring system. The system disclosed and claimed herein is responsive to the need.

A system and a method disclosed herein receive the output signal from a capacitance diaphragm gauge (CDG) and generate a noise reduced output signal. An input signal processing circuit receives an input signal from a signal source that drives the CDG. The input signal processing circuit generates a segment of N normalized digital samples of the input signal. An output signal processing circuit receives the output signal from the CDG and generates M segments of N digital samples of the CDG output signal and averages the corresponding samples in the M segments to generate a signal segment of N averaged samples. Each of the N averaged samples is multiplied by a corresponding one of the N normalized samples to generate N products. The N products are averaged to generate an average product, which is multiplied by a constant to generate a system output signal with reduced noise.

An aspect in accordance with embodiments disclosed herein is a method for reducing the noise in an output signal from a capacitance diaphragm gauge (CDG) that operates in response to a signal source that generates an input signal at a predetermined frequency and amplitude. The method includes a step of amplifying the output signal from the CDG. The method converts the output signal to N digital samples during a duration of a first predetermined time segment. The method converts the output signal to N digital samples during at least one additional predetermined time segment. Each additional predetermined time segment has a duration corresponding to the duration of the first predetermined time segment. The method averages each digital sample in the first predetermined time segment with a corresponding digital sample in each additional time segment to generate N averaged samples. The method converts the input signal to N digital samples during a time segment having a duration corresponding to the duration of the first predetermined time segment. The method normalizes the N digital samples of the input signal with a maximum amplitude of the N digital samples to generate N normalized samples of the input signal. The method multiplies each of the N digital samples with a corresponding one of the N averaged samples to generate N digital products and averages the N digital products to generate an average product. The method generates an output signal responsive to the average product. The output signal has a value representing a pressure applied to the CDG. In certain embodiments of the method, M is 10, N is 200; and the samples are converted at a rate of one sample per 20 microseconds.

Another aspect of embodiments disclosed herein is a noise reduction system for a capacitance diaphragm gauge (CDG) that generates a CDG output signal in response to an input signal from a signal source operating at a predetermined frequency and amplitude. The CDG output signal has an amplitude modulated by changes in pressure applied to the CDG. The CDG output signal is further modulated by noise. The noise reduction system processes the output signal from the CDG to reduce the noise and generate a system output signal. The system comprises an input signal processing circuit that generates a segment of N normalized digital samples of the input signal. The system further comprises an output signal processing circuit that generates M segments of N digital samples of the CDG output signal and that averages corresponding samples of the M segments to generate a single segment of N averaged digital samples. The system includes a first multiplier that multiplies each of the N averaged digital samples by a corresponding one of the N normalized digital samples to generate N digital products, and a product averager that averages the N digital products to generate an average product. The system includes a second multiplier that multiplies the average product by a constant to generate a system output signal. In certain embodiments of the system, the second multiplier multiplies the average product by two to generate the system output signal. In certain embodiments of the system, the input signal processing circuit comprises a first analog-to-digital (A/D) converter that converts the time-varying amplitude of the input signal to a plurality of digital values; a first sample and store circuit that samples the digital values from the A/D converter and that stores N digital values as a digitized input segment; and a normalizer circuit that determines a maximum magnitude of the N digital values in the digitized input segment and that normalizes the N digital values to the maximum magnitude to generate the N normalized digital values. In certain embodiments of the system, the output processing circuit comprises a second analog-to-digital (A/D) converter that converts the time-varying amplitude of the CDG output signal to a plurality of digital values; a second sample and store circuit that samples the digital values from the A/D converter and that stores M segments, each of the M segments comprising N digital samples of the CDG output signal; and a sample average circuit that averages corresponding samples of each of the M segments to generate the single segment of N digitized samples of the CDG output signal. In certain embodiments of the system, M is 10, N is 10, and the samples are converted at a rate of one sample per 20 microseconds. In certain embodiments, the system further includes a third multiplier that multiplies each of the N normalized digital samples from the input signal processing circuit by the average product from the product average to generate a digitized reproduction of the input signal modulated by changes in amplitude caused by the pressure applied to the CDG.

Another aspect in accordance with embodiments disclosed herein is a method for reducing the noise in an output signal from a transducer that operates in response to a signal source that generates an input signal at a predetermined frequency and amplitude. The method includes a step of amplifying the output signal from the transducer. The method converts the output signal to N digital samples during a duration of a first predetermined time segment. The method converts the output signal to N digital samples during at least one additional predetermined time segment. Each additional predetermined time segment has a duration corresponding to the duration of the first predetermined time segment. The method averages each digital sample in the first predetermined time segment with a corresponding digital sample in each additional time segment to generate N averaged samples. The method converts the input signal to N digital samples during a time segment having a duration corresponding to the duration of the first predetermined time segment. The method normalizes the N digital samples of the input signal with a maximum amplitude of the N digital samples to generate N normalized samples of the input signal. The method multiplies each of the N digital samples with a corresponding one of the N averaged samples to generate N digital products and averages the N digital products to generate an average product. The method generates an output signal responsive to the average product. The output signal has a value representing a parameter applied to the transducer.

BRIEF DESCRIPTION OF THE DRAWINGS

Embodiments in accordance with aspects of the present invention are described below in connection with the attached drawings in which.

DETAILED DESCRIPTION OF PREFERRED EMBODIMENTS

The improvements to capacitance diaphragms are disclosed herein with respect to exemplary embodiments of a system and a method. The embodiments are disclosed for illustration of the system and the method and are not limiting except as defined in the appended claims. Although the following description is directed to a particular embodiment of a capacitance diaphragm gauge, it should be understood that the disclosed system and method can be applied to other embodiments of capacitance diaphragm gauges.

Figure 1:
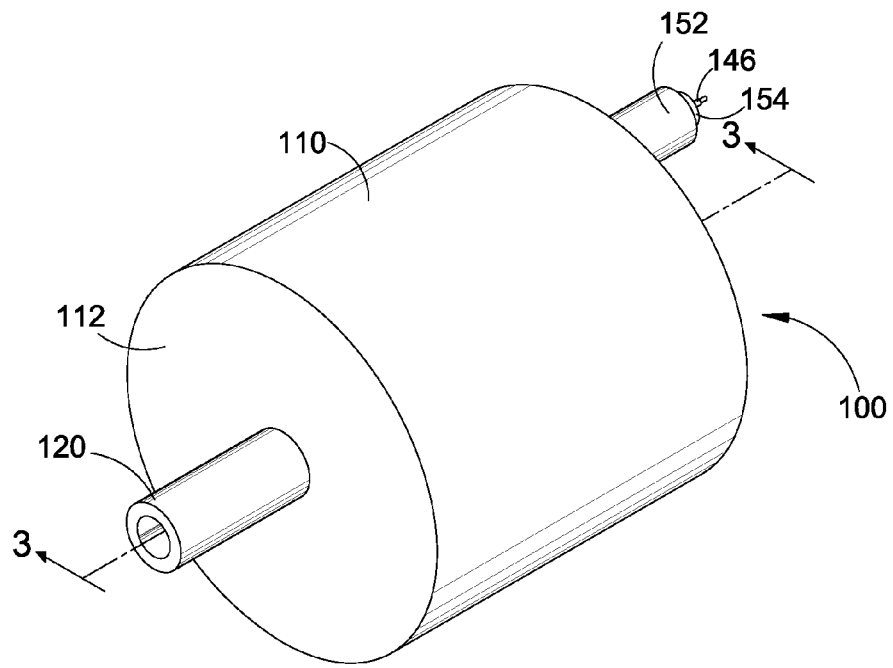
FIG. 1 illustrates a front perspective view of an exemplary capacitance diaphragm gauge (CDG), which is installable into a pneumatic system (not shown) to measure the pressure within the system.
Figure 2:
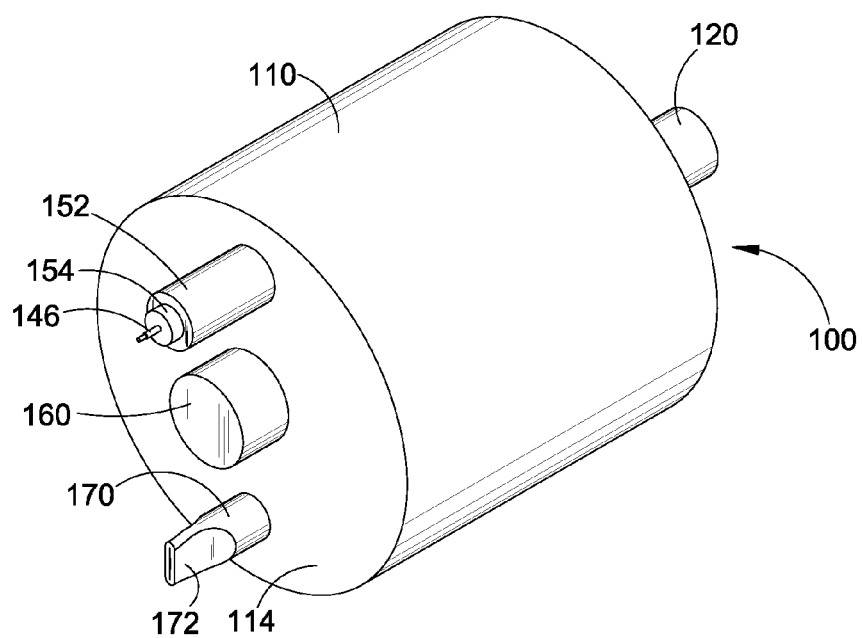
FIG. 2 illustrates a rear perspective view of the CDG of FIG. 1 which is rotated 180° from the view in FIG. 1.
Figure 3:
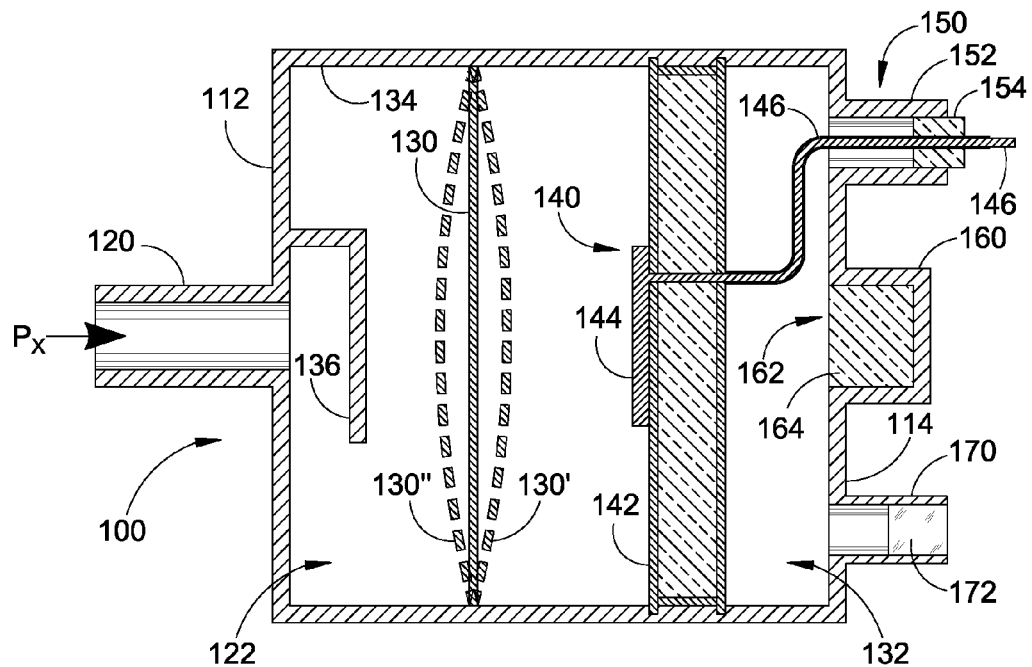
FIG. 3 illustrates a cross-sectional view of the CDG taken along the line 3--3 in FIG. 1, wherein the diaphragm appears undeflected in solid lines and appears in first and second deflected positions in dashed lines.

FIG. 1 illustrates a front perspective view of an exemplary capacitance diaphragm gauge (CDG) 100, which is installable into a pneumatic system (not shown) to measure the pressure within the system. In particular, the CDG is used to measure very low pressures resulting from evacuation of the pneumatic system. FIG. 2 illustrates a rear perspective view of the CDG of FIG. 1 which is rotated 180° from the view in FIG. 1. FIG. 3 illustrates a cross-sectional view of the CDG taken along the line 3--3 in FIG. 1.

In the illustrated embodiment, the CDG 100 comprises a hollow, generally cylindrical body structure 110, which extends between a first end surface 112 (FIG. 1) and a second end surface 114 (FIG. 2). A first cylindrical tube 120 extends from the first end surface. The first cylindrical tube provides pneumatic access to a first inner cavity 122 (FIG. 3) of the CDG. The first cylindrical tube is connectable to the pneumatic system (not shown) to allow the pressure of the system to be applied to the first inner cavity.

As shown in FIG. 2, a diaphragm 130 within the cylindrical body structure 110 separates the first inner cavity 122 from a second inner cavity 132. The diaphragm is sealed around its peripheral edges with respect to an inner surface 134 of the cylindrical body structure so that the first inner cavity is pneumatically isolated from the second inner cavity by the diaphragm. The diaphragm is also electrically connected to the cylindrical body structure, which is electrically connected to a ground reference, as discussed below.

In certain embodiments, the diaphragm 130 comprises Inconel 750 or another suitable material. In certain embodiments, the diaphragm has a thickness that can range from approximately 0.001 inch (0.025 mm) to approximately 0.015 inch (0.38 mm). The first inner cavity 122 also includes a baffle 136 that is positioned between the diaphragm and the first cylindrical tube 120. The baffle reduces the deposition of contaminants onto the surface of the diaphragm that faces the first inner cavity.

An electrode assembly 140 is positioned within the second inner cavity 132 between the diaphragm 130 and the second end surface 114. The electrode assembly comprises a mounting structure 142, which is secured to the inner surface 134 of the cylindrical body structure 110. The mounting structure of the electrode assembly is not sealed around the peripheral edges. Accordingly, both sides of the electrode assembly are at the same pressure within the second inner cavity. At least one electrode 144 is mounted on one side of the electrode assembly mounting structure. In particular, the electrode is mounted on the side of the mounting structure that faces the diaphragm. The electrode is electrically connected through the mounting structure. A conductor 146 extends from the mounting structure to a port 150 that extends through the second end surface 114 of the cylindrical body structure 110. The port 150 includes a second cylindrical tube 152 that extends outwardly from the second end surface. The conductor extends beyond the end of the second cylindrical tube. The conductor extends through a plug 154 that hermetically seals the second cylindrical tube around the conductor.

Although described herein with respect to one electrode on the electrode assembly, one skilled in the art will appreciate that the electrode assembly may include more than one electrode. See, for example, U.S. Pat. No. 4,823,603 to Ferran et al., which discloses two concentric fixed electrodes. U.S. Pat. No. 4,823,603 is incorporated herein by reference.

In the illustrated embodiment, a central portion 160 of the second end surface 114 extends outwardly to form an extended cavity portion 162 of the second inner cavity 132. The extended portion of the second inner cavity houses a getter 164. The getter functions in a conventional manner to remove small amounts of gas that may be released by the inner surface of the second inner cavity.

A third cylindrical tube 170 extends from the second end surface 114 of the cylindrical body structure 110. Initially, the entire length of the third cylindrical tube is uniformly cylindrical. The third cylindrical tube is connected to a vacuum evacuation system (not shown) to evacuate the gases from the second inner cavity 132 to create a desired low pressure within the second inner cavity. After the evacuation process is completed, an end portion 172 of the third cylindrical tube is crimped as shown in FIG. 1 to seal the second inner cavity to maintain the evacuated condition of the second inner cavity.

As illustrated in the cross-sectional view of FIG. 3, the diaphragm 130 is a thin metallic plate that separates the first inner cavity 122 from the second inner cavity 132. As discussed above, the second inner cavity is evacuated so that the absolute pressure within the second inner cavity is very low (e.g., approximately $10^{-9}$ Torr). The pressure within the first inner cavity is determined by the pressure Px of the system (not shown) to which the first cylindrical tube 120 is connected. When the pressure within the first inner cavity is substantially equal to the pressure within the second inner cavity, the diaphragm will not be deflected and will maintain the substantially flat shape shown by the solid cross-hatched profile (labeled as 130 in FIG. 3). If the pressure Px on the system side of the diaphragm (i.e., the pressure in the first inner cavity) exceeds the pressure in the second inner cavity, the center of the diaphragm will be deflected toward the second inner cavity and the diaphragm will bow into the second inner cavity as illustrated by a first dashed cross-hatched profile 130' in FIG. 3. If the pressure Px on the system side of the diaphragm is less than the pressure in the second inner cavity, the center of the diaphragm will be deflected toward to the first inner cavity and the diaphragm will bow into the first inner cavity as illustrated by a second dashed cross-hatched profile 130" in FIG. 3. In each case, the amount of the deflection will be determined by the pressure differential between the first and second inner cavities. The amount of deflection is also determined in part by the material properties of the diaphragm (e.g., the stiffness of the diaphragm).

As is well known in the art, the diaphragm 130 forms a first, movable plate of a variable capacitor. The electrode 144 on the electrode support structure 142 forms a second, fixed plate of the variable capacitor. When the diaphragm 130 is in the undeflected initial state, the capacitance of the variable capacitor has a first (initial) value determined by the initial distance between the diaphragm and the electrode. When the pressure Px increases, the diaphragm is deflected toward the second inner cavity and thus toward the fixed electrode as illustrated by the first dashed cross-hatched profile 130'. The deflection reduces the distance between the diaphragm and the electrode, which increases the capacitance of the variable capacitor. When the pressure Px decreases, the diaphragm is deflected toward the first inner cavity and thus away from the fixed electrode as illustrated by the second dashed cross-hatched profile 130". The deflection increases the distance between the diaphragm and the electrode, which decreases the capacitance of the variable capacitor. As discussed below, the capacitance is monitored and the increases and decreases in capacitance are used to determine corresponding increases and decreases in the system pressure Px. The CDG is initially calibrated by monitoring the changes in capacitance as a plurality of known values of the pressure Px are applied to the CDG.

Figure 4:
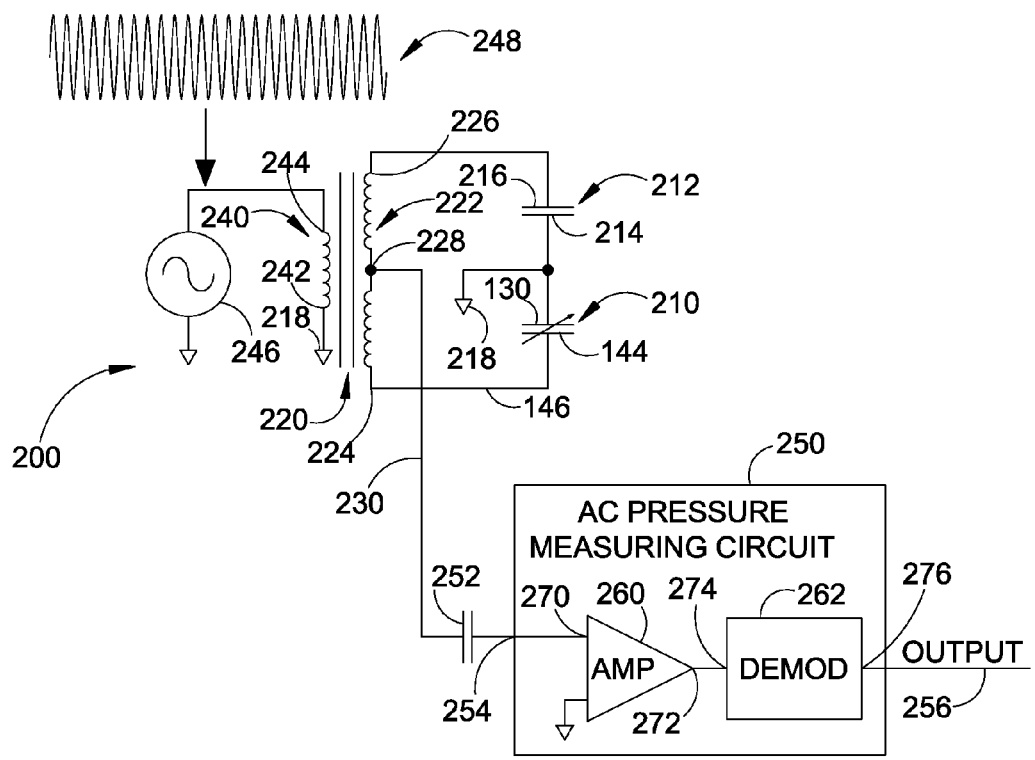
FIG. 4 illustrates a basic pressure monitoring system that monitors that the capacitance of the variable capacitor formed by the diaphragm and the fixed electrode of FIG. 3 to determine the deflection of the capacitor and thereby determined the pressure applied to the diaphragm.

FIG. 4 illustrates a simplified exemplary system 200 for monitoring the capacitance of the variable capacitor formed by the diaphragm 130 and the fixed electrode 144 of FIG. 3. The system comprises a first capacitor 210 and a second capacitor 212. The first capacitor comprises the variable capacitor formed by the diaphragm and the fixed electrode. Accordingly, a first electrode (the diaphragm) of the first capacitor is identified with the reference number 130, and a second electrode (the fixed electrode) of the first capacitor is identified with the reference number 144. The second capacitor is a conventional fixed capacitor. The second capacitor has a first electrode 214 and a second electrode 216.

The first electrode 130 of the first capacitor 210 and the first electrode 214 of the second capacitor 212 are connected to a ground reference 218. The second electrode 144 of the first capacitor is connected to a first terminal 224 of a center-tapped output (secondary) winding 222 of a transformer 220. The second electrode 216 of the second capacitor is connected to a second terminal 226 of the output winding of the transformer. A center-tap terminal 228 of the output winding of the transformer provides a signal output on a line 230.

In the illustrated embodiment, the first electrode (diaphragm) 130 of the first (variable) capacitor 210 is mechanically and electrically connected to the cylindrical body structure 110. The cylindrical body structure is electrically connected to the ground reference 218 when installed in the system having the pressure to be measured, thus providing the electrical connection of the diaphragm to the ground reference. The second electrode 144 of the first (variable) capacitor is connected to the second terminal of the transformer via the conductor 146 of FIG. 3.

In the illustrated embodiment, the capacitance of the second capacitor 212 is fixed. The capacitance of the second (fixed) capacitor is selected to be approximately equal to the initial capacitance between the diaphragm 130 and the fixed electrode 144 (e.g., the initial capacitance of the first (variable) capacitor 210) when the system pressure Px in the first inner cavity 122 is approximately equal to the pressure in the second inner cavity 132 as discussed above with respect to FIG. 3.

The transformer 220 has an input (primary) winding 240 having a first terminal 242 and a second terminal 244. The first terminal is connected to the ground reference 218. The second terminal is connected to a high frequency signal source 246 operating, for example, at a frequency of approximately 50 kilohertz as represented by an AC waveform 248.

The electrical conductor 230 connects the center tap 228 of the output winding 222 of the transformer 220 to an input 254 of an AC pressure measuring circuit 250 via an AC coupling capacitor 252. The AC pressure measuring circuit provides an output signal (OUTPUT) on an output signal line 256.

In the illustrated embodiment, the AC pressure measuring circuit 250 comprises an amplifier 260 and a demodulator 262. The signal on the center tap 228 of the output winding 222 of the transformer 220 is applied to an input 270 of the amplifier via the AC coupling capacitor 252. The amplifier preferably has a very high input impedance so that substantially zero current flows into the input of the amplifier. An output 272 of the amplifier provides an amplified output signal to an input 274 of the demodulator. An output 276 of the demodulator provides the output signal on the output signal line 256. The output signal is responsive to the variations in the capacitance of the first (variable) capacitor 210. Accordingly, the output signal varies in response to changes in the system pressure Px.

The signal generated by the high frequency signal source 250 is applied to the input (primary) winding 240 of the transformer 220. The applied signal is coupled to the secondary winding 222 and induces a high frequency voltage across the secondary winding. The induced voltage is applied across the series connection of the first (variable) capacitor 210 and the second (fixed) capacitor 212. The voltage across each capacitor is inversely proportional to the respective capacitance of the capacitor. Since the capacitance of the second (fixed) capacitor is substantially constant, the voltage across the first (variable) capacitor varies in accordance with the deflection of the diaphragm 130 caused by differential pressure across the diaphragm between the first inner cavity 122 and the second inner cavity 132 of the CDG 100. Because one electrode of each of each capacitor is electrically connected to the ground reference 218, a difference in the voltages across the two capacitors appears as a voltage differential across the output winding between the first input terminal 224 and the second input terminal 226 of the output winding of the transformer.

The voltage differential across the output winding 222 of the transformer 220 causes a voltage to appear on the center tap 228 of the output winding that is referenced to the ground reference 218 and that is proportional to the differences in the capacitance between the first (variable) capacitor 210 and the second (fixed) capacitor 212.

The voltage on the center tap 228 of the output winding 222 of the transformer 220 is applied via the conductor 230 and the AC coupling capacitor 252 to the input 270 of the amplifier 260. The amplifier amplifies the center tap voltage and provides the amplified signal as an output signal on the output 272. The output signal from the amplifier is a time-varying signal at the frequency of the signal source 250 with an amplitude that is proportional to the difference in capacitance of the first (variable) capacitor 210, which varies in response to changes in the pressure differential across the diaphragm 130. Accordingly, the amplitude of the time-varying signal output of the amplifier changes in response to changes in the pressure differential across the diaphragm.

The time-varying signal generated by the amplifier 260 is demodulated by the demodulator 262 in a conventional manner to provide the output signal on the output signal line 256 having a DC voltage level corresponding to the pressure differential across the diaphragm 130. The AC pressure measuring circuit is calibrated to equate the variations in the AC voltage to the absolute pressure (Px) applied to the diaphragm. In one embodiment, the demodulator comprises a synchronous demodulator known to the art.

Figure 5:
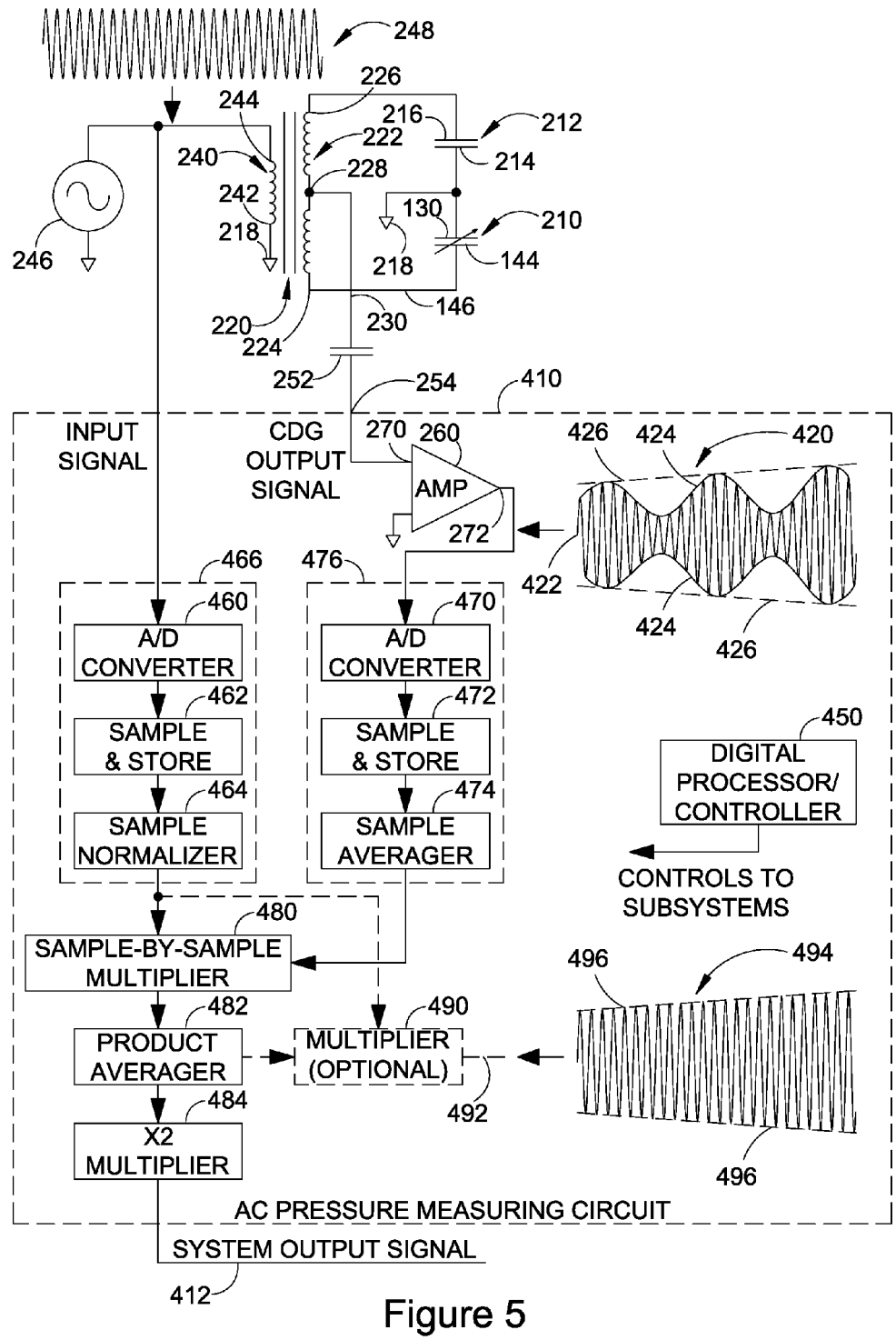
FIG. 5 illustrates an improved pressure monitoring system that compensates for the effects of random noise and spurious frequencies in a CDG.

FIG. 5 illustrates an improved pressure monitoring system 400 that includes noise reduction circuitry that operates to reduce or eliminate the effects of random noise and spurious signals on the measured output signal from the CDG 100. The improved measurement system of FIG. 5 includes elements that are described above with respect to the system illustrated in FIG. 4. Accordingly, like elements are identified with reference numbers corresponding to the reference numbers in FIG. 4. The elements of the measurement system in FIG. 5 up to and including the amplifier 260 in a modified AC pressure measuring circuit 410 are similar to the corresponding components in the previously described measuring system and are not described again in detail. Unlike the basic AC pressure measuring circuit 250 in FIG. 4, the modified AC pressure measuring circuit of FIG. 5 replaces the demodulator 262 of FIG. 4 with the noise reduction circuitry described below.

The AC pressure measuring circuit 410 in the system 400 of FIG. 5 operates as described below to measure the AC voltage developed between the center tap 228 of the secondary winding 222 and the common ground 218 and to generate a DC voltage on an output signal line 412 that is responsive to the changes in capacitance resulting from the deflection of the diaphragm 130 caused by the pressure (Px) applied to the diaphragm. As further illustrated in FIG. 5, the output 272 of the amplifier 260 in the AC pressure measuring circuit produces a modulated AC voltage output represented by a waveform 420. The modulated AC voltage output is an amplified reproduction of the modulated AC voltage from the center tap 228 of the secondary winding 222 of the transformer 220. As illustrated by the waveform 420, the output of the amplifier comprises a high frequency AC component 422 at the frequency of the original AC voltage 248 generated by AC source 246. The output of the amplifier is modulated by random noise and spurious intermediate frequencies, which are represented by a generally sinusoidal envelope 424. It should be understood that the random noise and spurious frequencies will generally be non-sinusoidal and will have varying amplitudes and frequencies in contrast to the representation shown in FIG. 5. The waveform 420 further includes a slowly varying amplitude modulation 426, which represents the changes in magnitude caused by changes in capacitance that result from pressure changes. It should be understood that over extended periods, the modulation caused by pressure changes is not likely to be linear as illustrated but will increase and decrease in response to changes in pressure.

In the illustrated embodiment, the modified AC pressure measuring circuit 410 of FIG. 5 comprises a digital processor/controller 450, which may be a general purpose microprocessor or may comprise application specific digital circuitry that is configured to generate the control signals discussed below.

The modified AC pressure measuring circuit 410 further includes a first analog-to-digital (A/D) converter 460 that is coupled directly to the AC voltage source 246 to receive the AC voltage from the sinusoidal voltage source. The first A/D converter digitizes the AC voltage at a high sample rate. For example, in one embodiment, the AC voltage operates at a frequency of 50 kHz, and the A/D converter digitizes the AC voltage at a frequency at least as high as the Nyquist sampling rate (e.g., at a sampling rate of at least 100 kHz). Preferably, the digitizing frequency (sampling rate) is selected to be a much higher frequency such as 10 MHz. Preferably, the sampling signals are controlled by the digital processor/controller 450.

The digitized AC voltage samples from the first A/D converter 460 are provided to an input of a first sample and store circuit 462. The first sample and store circuit samples the digitized AC voltage for at least one cycle of the AC signal from the sinusoidal voltage source 246. For example, for a 50 kHz AC voltage, the sample time is 20 microseconds. For a sampling frequency of 10 MHz, at least 200 samples of the AC signal are acquired and stored. It should be understood that if the digitizing frequency and the sampling frequency are the same, the first A/D converter and the first sample and store circuit may be combined in a single subsystem. The first sample and store circuit is synchronized with the original AC voltage so that each saved segment begins at a corresponding phase location with respect to the original AC voltage. Preferably, the synchronization of the sample and store circuit is controlled by the digital processor/controller 450. It should be understood that the first A/D converter and the first sample and store circuit can be combined as a single circuit that performs the conversion, the sampling and the conversion.

The sampled and stored digitized AC signals from the first sample and store circuit 462 are provided as an input to a sample normalizer circuit 464. The sample normalizer circuit operates in a conventional manner to analyze the sampled digitized signals to determine the peak magnitude of the sampled digitized signals. The sample normalizer circuit then sets the magnitude of the peak signal to a magnitude of 1 (unity) and then normalizes the magnitudes of all of the stored signals with respect to the peak signal. For example, if the peak magnitude has a digitized value of 0.8, a signal having a digitized magnitude of 0.6 would be normalized to a magnitude of 0.75. The normalized signals are stored as a normalized AC signal segment that has a duration of at least one cycle (e.g., a duration of 20 microseconds in the illustrated example). If sufficient time is available in view of the processing speed of the digital electronics, then additional cycles may be sampled to provide more sampled points, which will further reduce the noise. For purposes of explanation, the processing of only a single cycle is described herein. Preferably, the sample normalizer circuit is controlled by the digital processor/controller 450.

Together, the first A/D converter 460, the first sample and store circuit 462 and the sample normalizer circuit 464 comprise an input signal processing circuit 466 (outlined in dashed lines) that receives the input signal from the signal source 246 and that generates the normalized samples of the input signal as the output from the sample normalizer circuit.

The modulated AC voltage from the amplifier 260 within the AC pressure measuring circuit 250 is provided as the input to a second A/D converter 470. The second A/D converter operates at a corresponding digitizing frequency as the first A/D converter 460 (e.g., 10 MHz in the illustrated embodiment) to digitize the modulated AC voltage from the amplifier. The first A/D converter and the second A/D converter may be connected to the same input control signals from the digital processor/controller 450 to synchronize the respective digitizing processes. The second A/D converter produces digitized output signals which are provided as input signals to a second sample and store circuit 472, which is also preferably controlled by the digital processor/controller 450. The second sample and hold circuit samples the digitized modulated AC voltage for the same duration as the sampling of the carrier (e.g., for a duration of 20 microseconds in the illustrated embodiment). It should be understood that the second A/D converter and the second sample and store circuit can be combined as a single circuit that performs the conversion, the sampling and the conversion.

The second sample and store circuit 472 repeats the sample and store process on the digitized modulated AC signal for a plurality of additional segments and stores the sampled values for each segment. For example, in one embodiment, the second sample and store circuit saves samples from ten segments of the digitized modulated AC signal. As with the first sample and store circuit 464, the second sample and store circuit is synchronized with the original AC voltage so that each saved segment begins at a corresponding phase location with respect to the original AC voltage. For example, the digital processor/controller 450 advantageously provides control signals to the two sample and store circuits to start and stop the sample and store circuits at corresponding points in the respective sampled signal streams.

The sampled and stored segments from the second sample and store circuit 472 are provided as inputs to a sample averager circuit 474. The sample averager circuit adds the samples in the segments together on a point-by-point basis. In particular, a sample at a particular phase location in each saved segment is added to samples at the corresponding phase location in each of the other saved segments. For example, in the described embodiment having ten segments with 200 sample points in each segment, the sample averager circuit generates a first total for each of the ten sample points at the respective first phase locations in each segment. The sample averager circuit generates a second total for each of the ten sample points at the respective second phase locations in each segment. The sample averager circuit repeats this process for each of the third through 200th sample points in the segments to generate a respective total for each of the 200 sample points (phase locations). It should be understood that the totals may be generated in parallel to reduce the time required to generate the totals. The sample averager circuit then divides the 200 totals by the number of segments (e.g., 10) to obtain an average value for the digitized modulated AC signal at each point (each phase location) in the saved segments This averaging process reduces the random noise by the square root of the number of samples taken. The actual signal content caused by variations in the pressure varies in magnitude quite slowly, if at all, while the ten sampling segments are created. In contrast, magnitude of the random noise and spurious signals will tend to be different from segment-to-segment, and will therefore tend to cancel out over multiple segments. It should be understood that the sample average circuit may be a separate digital circuit as shown or may be part of the digital processor/controller 450.

The sample averager circuit 474 generates a single segment as an output; however, the single segment is generated every 200 microseconds as a rolling average of the preceding ten sampled segments provided as inputs to the sample average circuit.

Together, the second A/D converter 470, the second sample and store circuit 472 and the sample averager circuit 474 comprise a CDG output signal processing circuit 476 (outlined in dashed lines) that receives the amplified CDG output signal from the amplifier 260 and that generates the segment of averaged samples as the output from the sample average circuit. It should be understood that the amplifier may also be considered to be part of the CDG output signal processing circuit.

The averaged segment generated by the sample averager circuit is provided as a first input to a sample-by-sample multiplier 480. The output of the sample normalizer circuit 466 is provided as a second input of the sample-by-sample multiplier. As discussed above, the output of the sample normalizer circuit is the normalized representation of the original AC voltage.

The sample-by-sample multiplier 480 multiplies the output of the sample averager circuit 474 by the output of the sample normalizer circuit 4646 to generate a normalized product on a sample-by-sample basis. The normalized product includes data points corresponding to one cycle of the original AC voltage (e.g., 200 data points in the illustrated embodiment). The values of these data points are provided as inputs to a product averager circuit 482. The product averager circuit averages the data points to provide an average value of the multiplied data points during the cycle of the original AC signal.

The average value from the product averager circuit 482 is provided as an input to a times-two (×2) multiplier 484. The ×2 multiplier multiplies the average value by a constant (e.g., 2 in the illustrated embodiment) and generates an output signal on the output line 412 that comprises a digital value having a magnitude that corresponds to the slowly changing envelope of the changes in amplitude caused by pressure-induced capacitance changes. The changes in magnitude caused by random noise and by spurious frequencies have been canceled out by the averaging and processing steps performed by the circuits described above.

As further illustrated in FIG. 5, an optional multiplier 490 may be included. The optional multiplier receives the output of the product averager circuit 482 as a first input and receives the output of the sample normalizer 464 as a second input. The optional multiplier multiplies the average product from the product average circuit by the normalized AC voltage from the sample normalizer circuit and generates a filtered waveform 494 on an output line 492. The filtered waveform corresponds to the modulated waveform 420 produced by the amplifier 260; however, the filtered waveform does not include the modulation 424 caused by the random noise and the spurious frequencies. Rather, as shown the modulation is eliminated or substantially reduced so that an envelope 496 of the modulation of the waveform represents only the gradual changes in amplitude caused by capacitance changes responsive to changes in the pressure (Px).

Figure 6:
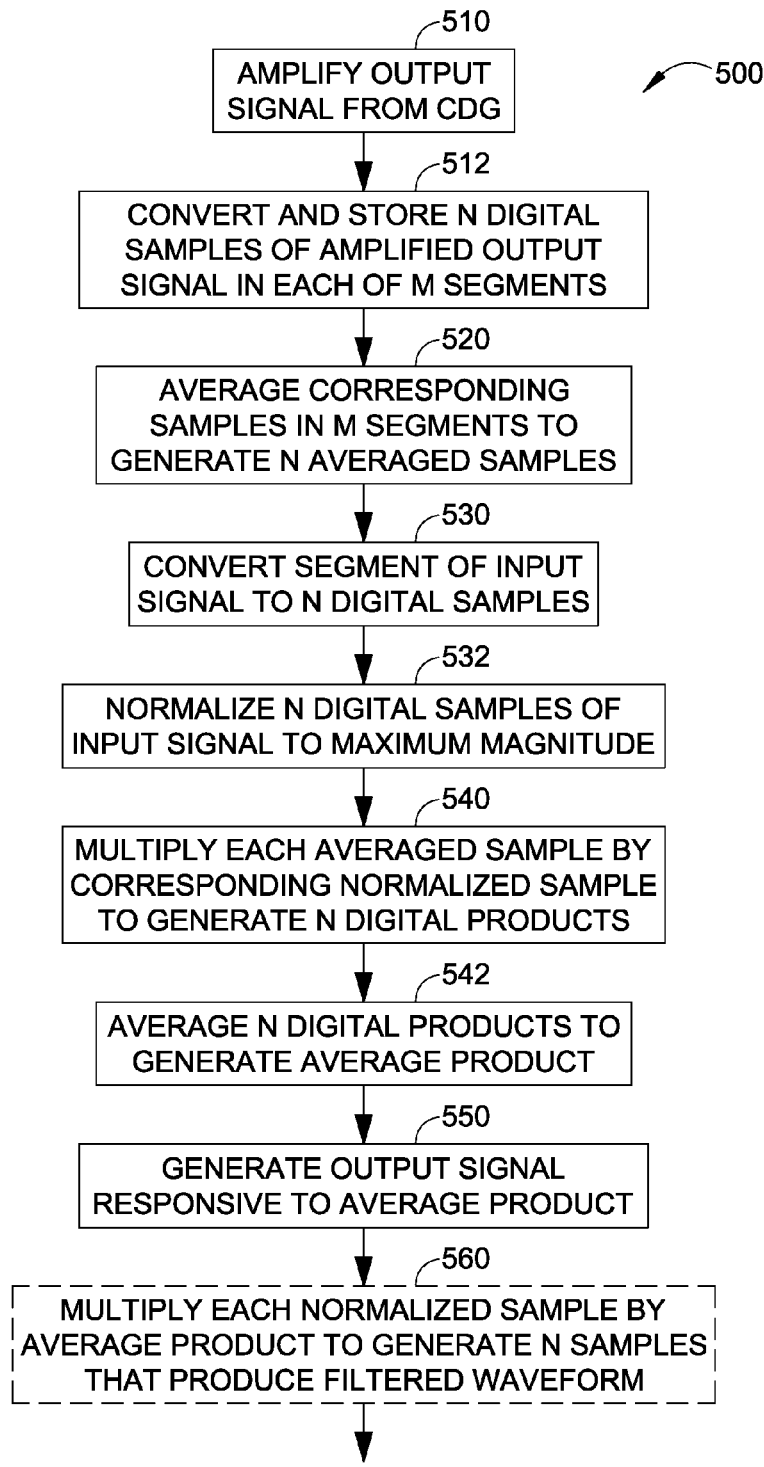
FIG. 6 illustrates a flow chart that explains the operation of the pressure monitoring system of FIG. 5.

The operation of the AC pressure measuring circuit 410 of FIG. 5 is illustrated by a flow chart 500 in FIG. 6. In a step 510, the output signal from the CDG is amplified by the amplifier 260 of FIG. 5. In a step 512, the amplified output signal is converted to digital samples and the digital samples are stored. In particular M segments of N digital samples each are generated. As described above, in the illustrated embodiment, N is equal to 200 and M is equal to 10 such that 10 segments of 200 samples per segment are digitized and stored. At a sample rate of 10 MHz, the each of the M segments has a duration of approximately 20 microseconds.

The flow chart 500 continues in a step 520 wherein the corresponding samples in the M segments are averaged to generate N averaged samples. As discussed above, the first sample in the first segment is added to the first sample in each of the other M−1 segments and the total is divided by M to generate the first averaged sample. The second sample in the first segment is added to the second sample in each of the other M−1 segments and the total is divided by M to generate the second averaged sample. The process is repeated for each of the other N−2 samples in the M segments to generate the third through $N^{th}$ averaged sample.

In a step 530, the original input signal 248 from the signal source 246 in FIG. 5 is sampled for a duration corresponding to the duration of one of the M segments to generate N digital samples. In a step 532, the N digital samples are normalized to a magnitude corresponding to the greatest magnitude of the N samples to generate N normalized samples of the input signal. It should be understood that the step 530 and the step 532 are performed in parallel with the steps 510, 512 and 530 such the normalized samples of the input signal are available when the M segments of the output signal are available.

In a step 540, each of the N averaged samples of the input signal from the step 520 are multiplied by the corresponding normalized sample of the input signal from the step 532 to generated N digital products. In particular, the first averaged sample is multiplied by the first normalized sample to generate the first digital product. The second averaged sample is multiplied by the second normalized sample to generate the second digital product. The process is repeated such that the $N^{th}$ averaged sample is multiplied by the $N^{th}$ normalized sample to generate the $N^{th}$ digital product. In a step 542, the N digital products are averaged to generate an average product.

In a step 550, an output signal is generated that is responsive to the average product. In the illustrated embodiment, the output signal is generated by multiplying the average product by 2.

As further illustrated in the flow chart 500, the AC pressure measuring circuit 410 of FIG. 5 may perform an optional step 560 in which the N normalized samples from the step 532 are multiplied by the average product from the step 542 to generate a filtered waveform that corresponds to the waveform 494 in FIG. 5. As discussed above, the filtered waveform represents the output of the amplifier 260 in the absence of random noise and spurious frequencies.

The sampling and processing steps described above are repeated on a generally continuous basis while the pressure is being measured so as to be responsive to changes in random noise and changes in spurious frequencies. It can be seen that the circuitry and the processing steps described above are much simpler than the circuitry and processing required to implement complex conventional signal processing techniques, such as fast Fourier transform (FFT) analysis or the like. Having a single, known carrier frequency from the AC signal source 246 allows the described circuitry and steps to provide a clean output signal in the presence of noise and spurious frequencies at a much lower cost and complexity than previously known.

Although the embodiments disclosed herein are directed to a capacitance diaphragm gauge, one skilled in the art will appreciate that the system and method can also be used with other types of transducers that utilize a source with a fixed frequency to drive the transducer. For example, the system and method can also be used with a transducer that varies the reluctance of an element in response to a parameter to be measured. The variations in the output signal from the transducer are processed as described above for the CDG.

As various changes could be made in the above constructions without departing from the scope of the invention, it is intended that all the matter contained in the above description or shown in the accompanying drawings shall be interpreted as illustrative and not in a limiting sense.

What is claimed is:

1. A method for processing a high frequency signal, the high frequency signal comprising a reference signal operating at a predetermined fixed frequency and a fixed amplitude, the reference signal modulated by an unknown modulation signal, the method reproducing the unknown modulation signal in the presence of noise that also modulates the reference signal, the method comprising:
   converting the high frequency signal to N digital samples during a duration of a first predetermined time segment;
   converting the high frequency signal to N digital samples during at least one additional predetermined time segment, each additional predetermined time segment having a duration corresponding to the duration of the first predetermined time segment;
   averaging each digital sample in the first predetermined time segment with a corresponding digital sample in each additional time segment to generate N averaged samples;
   converting the reference signal to N digital samples during a time segment having a duration corresponding to the duration of the first predetermined time segment;
   normalizing the N digital samples of the reference signal with a maximum amplitude of the N digital samples of the reference signal to generate N normalized samples of the reference signal;
   multiplying each of the N normalized samples with a corresponding one of the N averaged samples to generate N digital products;
   averaging the N digital products to generate an average product; and
   generating an output signal responsive to the average product, the output signal representing the unknown modulation signal.

2. A system for processing a modulated high frequency signal in the presence of noise, the modulated high frequency signal comprising a reference signal operating at a predetermined frequency and a fixed amplitude, the modulated high frequency signal modulated by an unknown modulation signal and by noise, the system processing the modulated high frequency signal to reproduce the unknown modulation signal, the system comprising:
   a first signal processing circuit having an input that receives the reference signal, the first signal processing circuit sampling the reference signal to generate a segment of N normalized digital samples of the reference signal;
   a second signal processing circuit having an input that receives the modulated high frequency signal, the second signal processing circuit sampling the modulated high frequency signal and generating M segments of N digital samples of the modulated high frequency signal, the second signal processing circuit averaging corresponding samples of the M segments to generate a single segment of N averaged digital samples of the modulated high frequency signal;
   a first multiplier that multiplies each of the N averaged digital samples of the modulated high frequency signal by a corresponding one of the N normalized digital samples of the reference signal to generate N digital products;
   a product averager that averages the N digital products to generate an average product; and
   a second multiplier that multiplies the average product by a constant to generate a system output signal that represents the unknown modulation signal.

3. The system as defined in claim 2, wherein:
   the first signal processing circuit comprises:
     a first analog-to-digital (A/D) converter that converts the time-varying amplitude of the reference signal to a plurality of digital values;
     a first sample and store circuit that samples the digital values from the first A/D converter and that stores N digital values as a digitized input segment; and
     a normalizer circuit that determines a maximum magnitude of the N digital values in the digitized input segment and that normalizes the N digital values to the maximum magnitude to generate the N normalized digital values;
   and
   the second signal processing circuit comprises:
     a second analog-to-digital (A/D) converter that converts the time-varying amplitude of the modulated high frequency signal to a plurality of digital values;
     a second sample and store circuit that samples the digital values from the second A/D converter and that stores M segments, each of the M segments comprising N digital samples of the modulated high frequency signal; and
     a sample average circuit that averages corresponding samples of each of the M segments to generate the single segment of N averaged digitized samples of the modulated high frequency signal.

4. The system as defined in claim 2, further comprising a third multiplier that multiplies each of the N normalized digital samples from the first signal processing circuit by the average product from the product averager to generate a digitized reproduction of the reference signal modulated by changes in amplitude caused by the unknown modulation signal.

5. A method for reducing the noise in a modulated signal produced by modulating a reference signal operating at a predetermined frequency and a predetermined amplitude with an unknown modulation signal, the method comprising:
   converting the modulated signal to N digital samples of the modulated signal during a duration of a first predetermined time segment;
   converting the modulated signal to N digital samples of the modulated signal during at least one additional predetermined time segment, each additional predetermined time segment having a duration corresponding to the duration of the first predetermined time segment;
   averaging each digital sample of the modulated signal in the first predetermined time segment with a corresponding digital sample of the modulated signal in each additional time segment to generate N averaged samples;
   converting the reference signal to N digital samples of the reference signal during a time segment having a duration corresponding to the duration of the first predetermined time segment;
   normalizing the N digital samples of the reference signal with a maximum amplitude of the N digital samples of the reference signal to generate N normalized samples of the reference signal;
   multiplying each of the N digital samples of the reference signal with a corresponding one of the N averaged samples of the modulated signal to generate N digital products;
   averaging the N digital products to generate an average product; and
   generating an output signal responsive to the average product, the output signal representing the unknown modulation signal.

* * * * *